United States Patent
Yeh et al.

(10) Patent No.: US 10,074,622 B2
(45) Date of Patent: Sep. 11, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chang-Lin Yeh, Kaohsiung (TW); Jen-Chieh Kao, Kaohsiung (TW); Chih-Yi Huang, Kaohsiung (TW); Fu-Chen Chu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 8 days.

(21) Appl. No.: 15/425,723

(22) Filed: Feb. 6, 2017

(65) Prior Publication Data
US 2018/0226365 A1    Aug. 9, 2018

(51) Int. Cl.
*H01L 23/49*   (2006.01)
*H01L 43/02*   (2006.01)
*H01L 23/66*   (2006.01)
*H01L 23/498*  (2006.01)

(52) U.S. Cl.
CPC ........ *H01L 23/66* (2013.01); *H01L 23/49838* (2013.01); *H01L 43/02* (2013.01); *H01L 2223/6605* (2013.01); *H01L 2223/6677* (2013.01)

(58) Field of Classification Search
CPC ....... H01L 43/02; H01L 23/49; H01L 23/498; H01L 23/4983; H01L 23/49838; H01L 23/66
USPC ......................................................... 257/421
See application file for complete search history.

(56) References Cited

U.S. PATENT DOCUMENTS

| | | | |
|---|---|---|---|
| 8,294,546 B2 | 10/2012 | Hatase | |
| 9,461,001 B1* | 10/2016 | Tsai | ...................... H01L 23/552 |
| 2009/0160595 A1* | 6/2009 | Feng | ................... H01F 17/0033 336/200 |

* cited by examiner

*Primary Examiner* — Monica D Harrison
(74) *Attorney, Agent, or Firm* — Foley & Lardner LLP; Cliff Z. Liu

(57) ABSTRACT

A semiconductor package device includes a substrate, a first package body, a permeable element and a coil. The substrate includes a first surface. The first package body encapsulates the first surface of the substrate. The permeable element includes a first portion disposed on the first surface of the substrate and a second portion disposed on the package body. The coil is within the first package body.

20 Claims, 18 Drawing Sheets

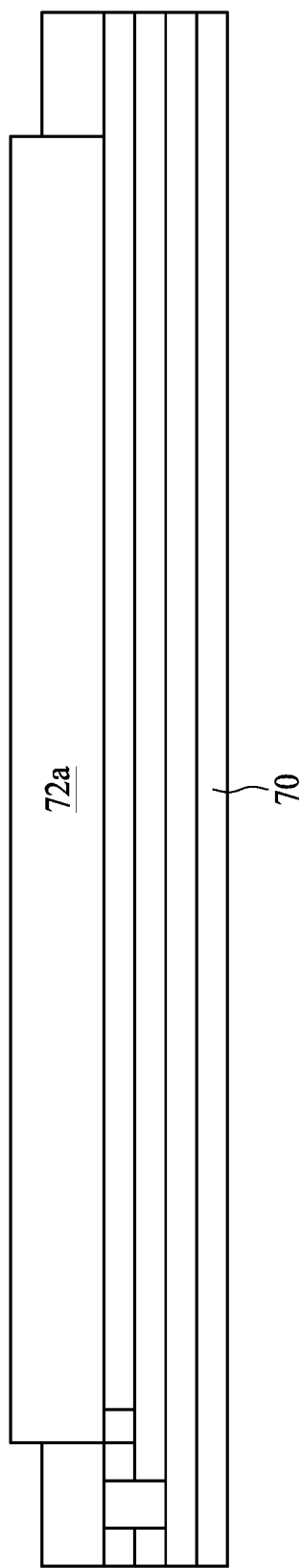

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including an antenna embedded therein and a method of manufacturing the same.

2. Description of the Related Art

Near Field Communication (NFC) is a short-distance, high-frequency wireless communication technology and includes contact-free radio frequency identification (RFID) and interconnection technologies.

The NFC technology can be applied to products such as a credit card, an identification (ID) card, a smart phone or a wireless charger. It would be desirable to improve communication quality and to reduce a total package size of an NFC device.

SUMMARY

In accordance with some embodiments of the present disclosure, a semiconductor device package includes a substrate, a first package body, a permeable element and a coil. The substrate includes a first surface. The first package body encapsulates the first surface of the substrate. The permeable element includes a first portion disposed on the first surface of the substrate and a second portion disposed on the package body. The coil is within the first package body.

In accordance with some embodiments of the present disclosure, a semiconductor device package includes a substrate, a first package body, a permeable element and a coil. The substrate includes a first surface. The first package body encapsulates the first surface of the substrate. The permeable element includes a first portion disposed on the first surface of the substrate and a second portion disposed on the package body. The coil is within the first package body. A width of the second portion of the permeable element is less than an inner width of the coil.

In accordance with some embodiments of the present disclosure, a semiconductor device package includes a substrate, a first package body, a permeable element and a coil. The substrate includes a first surface. The first package body encapsulates the first surface of the substrate. The permeable element includes a first portion disposed on the first surface of the substrate and a second portion disposed on the package body. The coil is within the first package body. A projection of the second portion of the permeable element onto the first surface of the substrate and a projection of the coil onto the first surface of the substrate do not overlap.

BRIEF DESCRIPTION OF THE DRAWINGS

FIG. 7A, FIG. 7B, FIG. 7C and FIG. 7D illustrate a semiconductor manufacturing method in accordance with some embodiments of the present disclosure.

Figure 1:
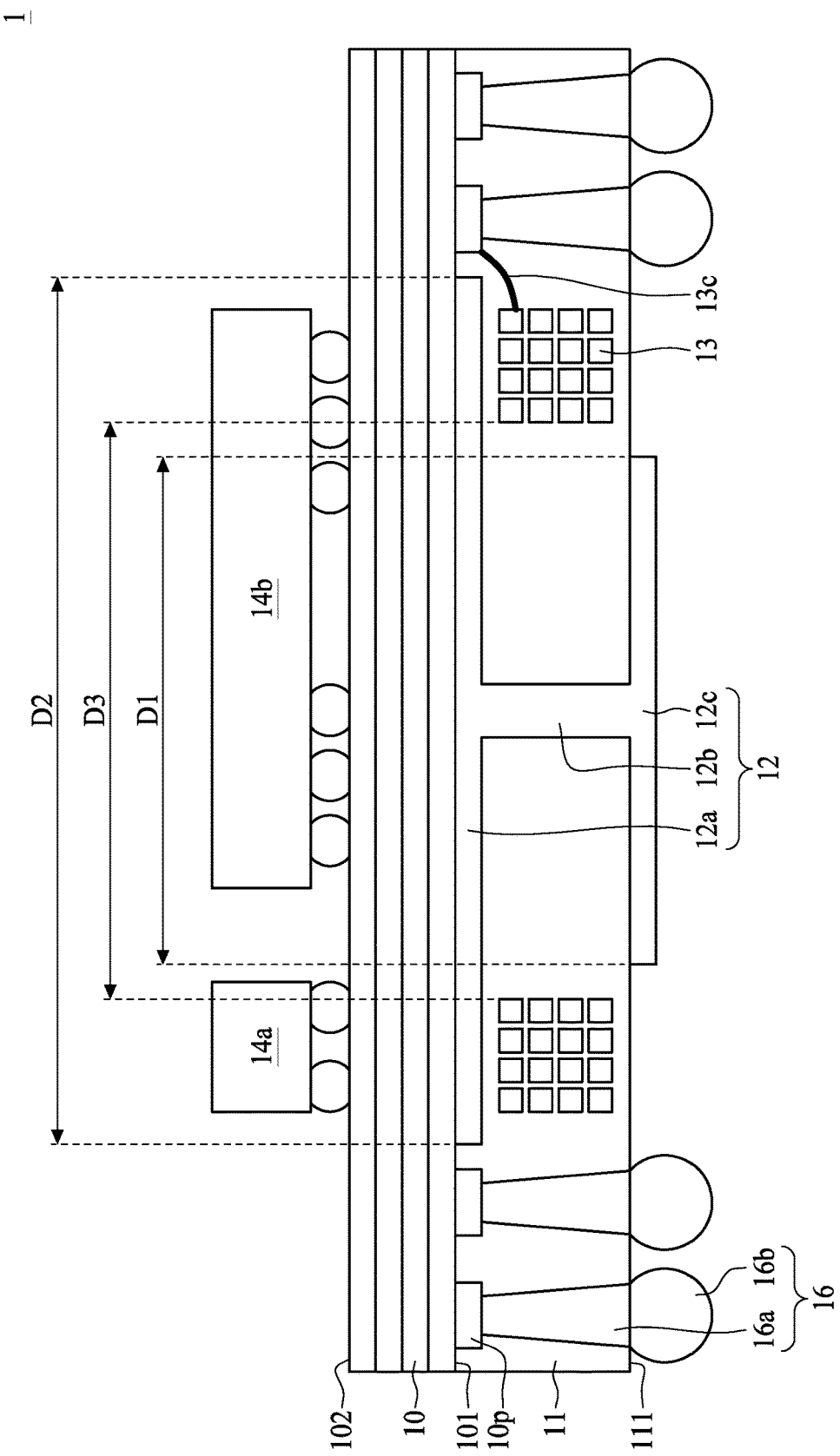
FIG. 1 illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In some embodiments of this disclosure, for example, in some embodiments in which radio frequency identification (RFID) is used for Near Field Communications (NFC), an antenna structure is used for passive RFID, semi-passive RFID, or active RFID, each of which may benefit from improvements in communication quality and increased communication distance. Of these forms of RFID, in addition to challenges related to transmission through the antenna structure, passive RFID faces an additional challenge in that power to operate logic in a passive RFID device is received by way of an induced current from an associated antenna structure, and the received power should be sufficient to power the logic in the RFID device. Thus, in passive RFID devices, the antenna structure may be used both to receive a power transfer (e.g., the induced current) and to transmit information. Current may be induced in the antenna structure by passing the antenna through a magnetic field, such as a magnetic field generated by an RFID reader. The magnetic field is strongest closest to the source, and diminishes as a distance from the source increases. An improvement in the reception capability of the antenna structure may allow for an RFID device to receive sufficient power to operate the logic of the RFID device at an increased distance from a magnetic field source. Additionally, an improvement in the reception capability of the antenna may also improve the transmission capability of the antenna. Because of the additional challenges faced by passive RFID, some embodiments of the present disclosure are described as an antenna structure useful for improving a passive RFID device. However, one of ordinary skill in the art will understand that such an antenna structure will also be useful for improving other NFC devices, and indeed, non-NFC devices.

FIG. 1 illustrates a cross-sectional view of a semiconductor package device 1 in accordance with some embodiments of the present disclosure. The semiconductor package device 1 includes a substrate 10, a package body 11, a magnetically permeable element 12, a coil 13, electronic components 14a, 14b and an electrical connection 16.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the grounding element is a via exposed from a lateral surface of the substrate 10. In some embodiments, the grounding element is a metal layer exposed from the lateral surface of the substrate 10. In some embodiments, the grounding element is a metal trace exposed from the lateral surface of the substrate 10. In some embodiments, the substrate 10 includes a surface 101 and a surface 102 opposite to the surface 101. The surface 101 of the substrate 10 is referred to as a bottom surface or a first surface and the surface 102 of the substrate 10 is referred to as a top surface or a second surface.

The electronic components 14a, 14b are disposed on the top surface 102 of the substrate 10. The electronic component 14a may include a passive electronic component, such as a capacitor, a resistor or an inductor. The electronic component 14b may include an active electronic component, such as an integrated circuit (IC) chip or a die. Each electronic component 14a, 14b may be electrically connected to one or more of another electronic component (e.g., the other electronic component 14a, 14b) and to the substrate 10 (e.g., to the RDL), and electrical connection may be attained by way of flip-chip or wire-bond techniques.

The package body 11 is disposed on the bottom surface 101 of the substrate 10 and encapsulates the coil 13 and a portion of the magnetically permeable element 12. In some embodiments, the package body 11 includes an epoxy resin including fillers dispersed therein.

The electrical connection 16 includes a first portion 16a and a second portion 16b. The first portion 16a of the electrical connection 16 penetrates the package body 11 and is electrically connected to a conductive pad 10p on the bottom surface 101 of the substrate 10. The second portion 16b of the electrical connection 16 is exposed from the package body 11 to be electrically connected to external devices.

The magnetically permeable element 12 includes three segments 12a, 12b and 12c. The segment 12a is disposed on the bottom surface 101 of the substrate 10 and encapsulated by the package body 11. The segment 12c is disposed on a surface 111 of the package body 11. The segment 12b penetrates the package body 11 and connects the segment 12a with the segment 12c. In some embodiments, a thickness of the segment 12b is the same as or larger than that of the segment 12a. In some embodiments, the magnetically permeable element 12 may include a magnetic layer and a conductive layer which is electrically connected to a grounding pad on the bottom surface 101 of the substrate 10.

The magnetically permeable element 12 is, or includes, a material with a high permeability and low magnetic saturation. The magnetically permeable element 12 can be, or can include, for example, Ferrite, such as, but not limited to, ferric oxide ($Fe_2O_3$), zinc ferrite ($ZnFe_2O_4$), manganese-zinc ferrite ($Mn_aZn_{(1-a)}Fe_2O_4$) or nickel-zinc ferrite ($Ni_aZn_{(1-a)}Fe_2O_4$), Ferroalloy, such as, but not limited to, ferrosilicon (FeSi), ferro silicon manganese (FeSiMg), iron phosphide (FeP) or iron-nickel (FeNi), magnetic adhesive or other magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetically permeable element 12 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured at room temperature and at a particular field strength, such as about 0.5 Tesla or about 0.002 Tesla. In some embodiments, the permeability of the magnetically permeable element 12 is in a range from about 500 henry per meter (H/m) to about 3000 H/m.

The coil 13 is disposed within the package body 11 and encapsulated by the package body 11. The coil 13 surrounds the segment 12b of the magnetically permeable element 12. In some embodiments, an inner diameter D3 of the coil 13 is greater than a width D1 of the segment 12c of the magnetically permeable element 12 and less than a width D2 of the segment 12a of the magnetically permeable element 12. For example, a projection of the segment 12c of the magnetically permeable element 12 on the bottom surface 101 of the substrate 10 (e.g., a vertical projection extending from the segment 12c to the bottom surface 101 of the substrate 10) and a projection of the coil 13 on the bottom surface 101 of the substrate 10 (e.g., a vertical projection extending from the coil 13 to the bottom surface 101 of the substrate 10) do not overlap. In addition, a projection of the segment 12a of the magnetically permeable element 12 on the bottom surface 101 of the substrate 10 (e.g., a vertical projection extending from the segment 12a to the bottom surface 101 of the substrate 10) overlaps a projection of the coil 13 on the bottom surface 101 of the substrate 10 (e.g., a vertical projection extending from the coil 13 to the bottom surface 101 of the substrate 10).

The coil 13 is, or includes, a conductive material such as a metal or metal alloy. Examples include gold (Au), silver (Ag), aluminum (Al), copper (Cu), or an alloy thereof. The coil 13 can be magnetically coupled to a magnetic field to induce a current within the coil 13. In some embodiments, the induced current is provided to the electronic components 14a, 14b through a conductive line 13c and the interconnection structure (e.g., the RDL) within the substrate 10, so as to power the electronic components 14a, 14b or other electronic components external to the semiconductor package device 1. Thus, the coil 13 performs as a wireless receiver (e.g., a charging coil).

In comparable wireless charging devices, the coil is an individual element separated from other electronic components, which would increase the total size and manufacturing costs of the wireless charging devices. By integrating a wireless charging coil into the semiconductor package device 1 as shown in FIG. 1, the total size and manufacturing costs can be reduced. In addition, since the width D2 of the segment 12a of the magnetically permeable element 12 is greater than the inner diameter D3 of the coil 13, the segment 12a can reduce the likelihood of (e.g., prevent) the electronic components 14a, 14b on the top surface 102 of the substrate 10 from being interfered with by undesired magnetic fields passing through the coil 13. Furthermore, the segment 12c of the magnetically permeable element 12 is used to aggregate the magnetic field to increase the efficiency for generating induced current. The magnetically permeable element 12 is also beneficial for heat dissipation of the semiconductor package device 1.

Figure 2:
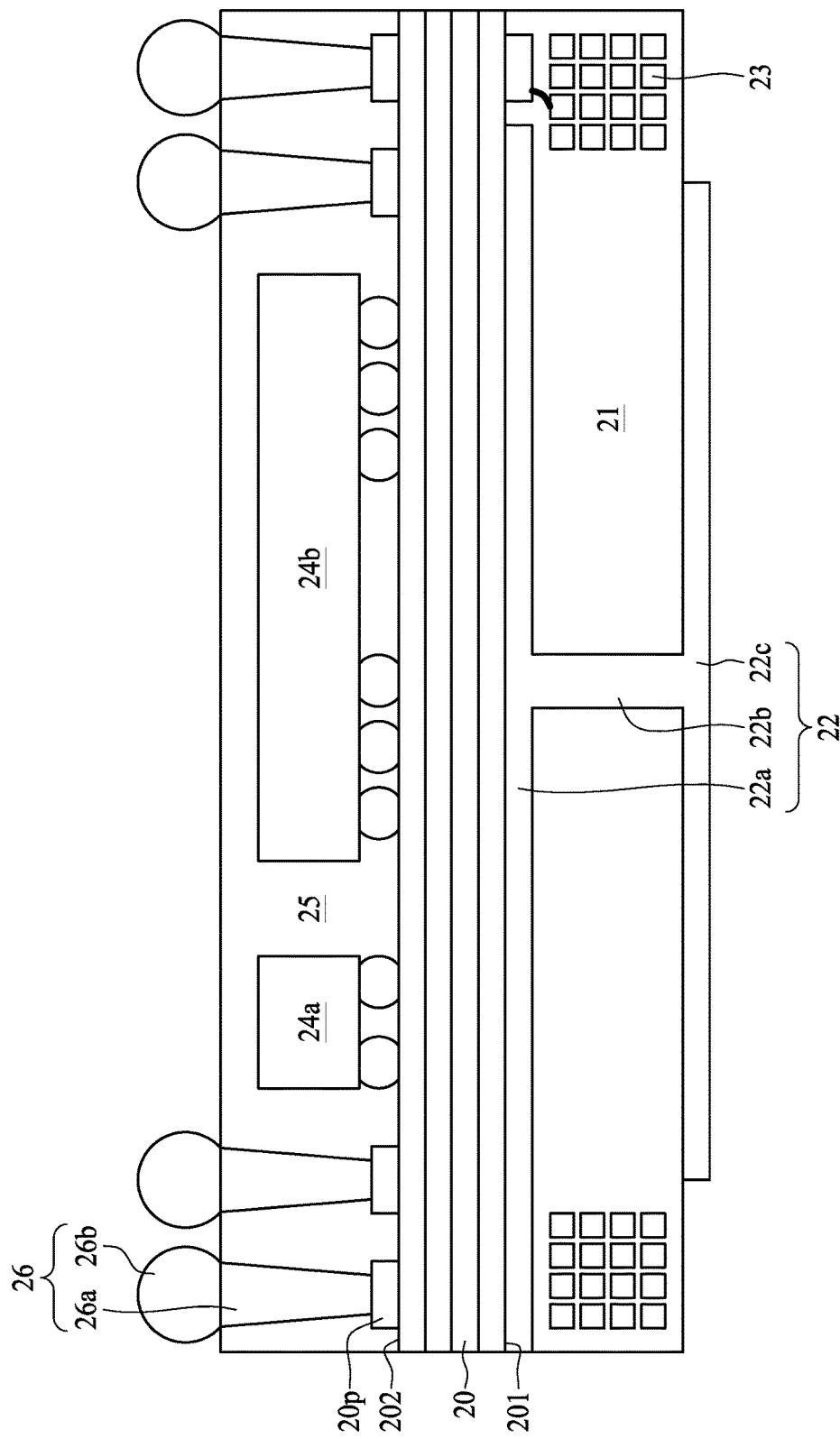
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 in FIG. 1, except that the semiconductor package device 2 further includes a second package body 25 disposed on a top surface 202 of a substrate 20. The semiconductor package device 1 includes the substrate 20 (e.g., similar to the substrate 10), a first package body 21 (e.g., similar to the package body 11), a magnetically permeable element 22 (e.g., similar to the magnetically permeable element 12), a coil 23 (e.g., similar to the coil 13), electronic components 24a and 24b (e.g., similar to electronic components 14a, 14b, respectively), and the second package body 25.

The second package body 25 is disposed on the top surface 202 of the substrate 20 to cover the electronic components 24a, 24b. In some embodiments, the second package body 25 includes an epoxy resin including fillers dispersed therein.

The electrical connection 26 includes a first portion 26a and a second portion 26b. The first portion 26a of the electrical connection 26 penetrates the second package body 25 and is electrically connected to a conductive pad 20p on the top surface 202 of the substrate 20. The second portion 26b of the electrical connection 26 is exposed from the second package body 25 to be electrically connected to external devices.

Figure 3:
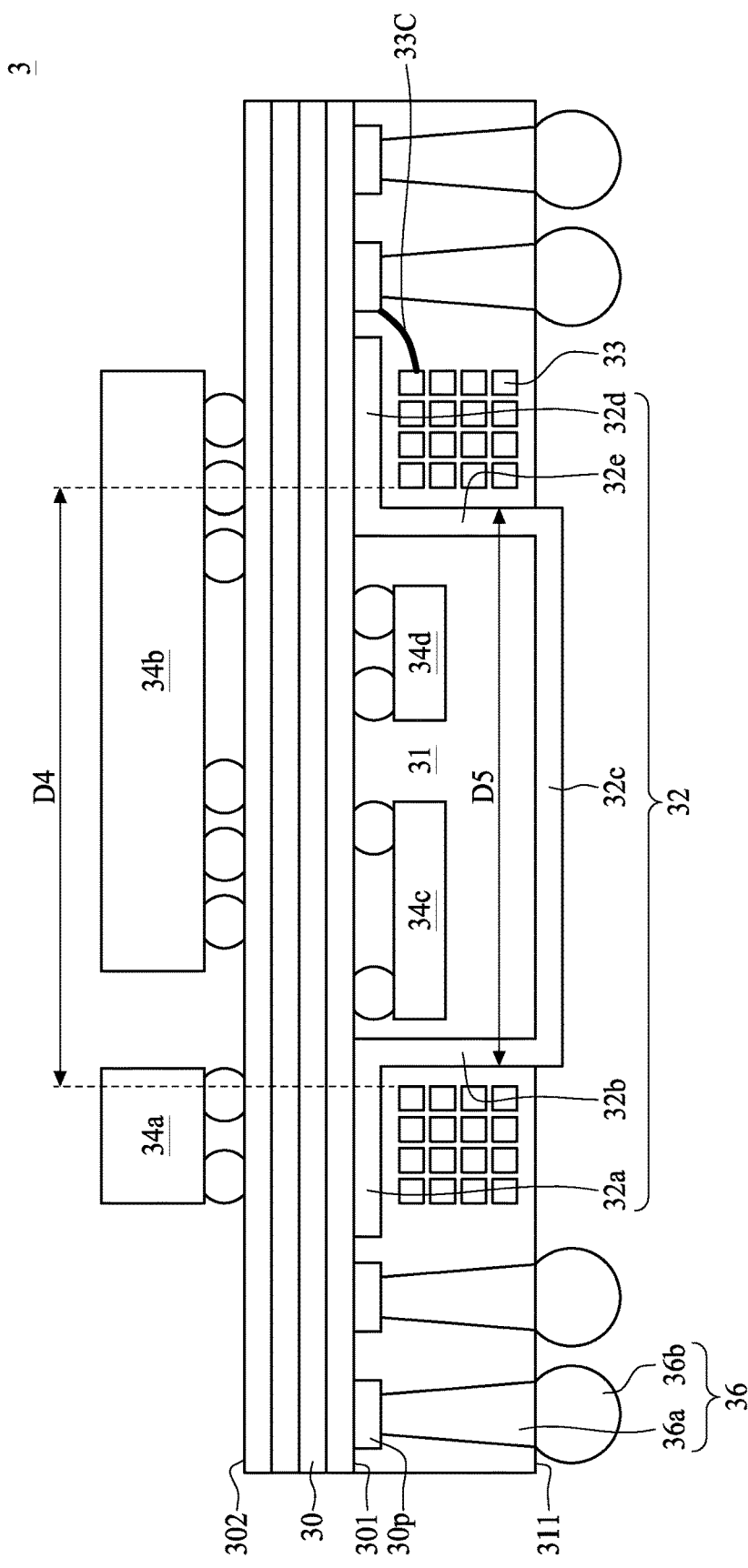
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 includes a substrate 30, a package body 31, a magnetically permeable element 32, a coil 33, electronic components 34a, 34b, 34c, 34d and an electrical connection 36.

The substrate 30 may include, for example, a printed circuit board, such as a paper-based copper foil laminate, a composite copper foil laminate, or a polymer-impregnated glass-fiber-based copper foil laminate. The substrate 30 may include an interconnection structure, such as an RDL or a grounding element. In some embodiments, the grounding element is a via exposed from a lateral surface of the substrate 30. In some embodiments, the grounding element is a metal layer exposed from the lateral surface of the substrate 30. In some embodiments, the grounding element is a metal trace exposed from the lateral surface of the substrate 30. In some embodiments, the substrate includes a surface 301 and a surface 302 opposite to the surface 301. The surface 301 of the substrate 30 is referred to as a bottom surface or a first surface and the surface 302 of the substrate 30 is referred to as a top surface or a second surface.

The electronic components 34a, 34b are disposed on the top surface 302 of the substrate 30. The electronic components 34c, 34d are disposed on the bottom surface 301 of the substrate 30. In some embodiments, each electronic component 34a, 34b, 34c, 34d may include a passive electronic component, such as a capacitor, a resistor or an inductor. In other embodiments, each electronic component 34a, 34b, 34c, 34d may include an active electronic component, such as an IC chip or a die. Each electronic component 34a, 34b, 34c, 34d may be electrically connected to one or more of another electronic component (e.g., one or more of the electronic components 34a, 34b, 34c, 34d) and to the substrate 30 (e.g., to the RDL), and electrical connection may be attained by way of flip-chip or wire-bond techniques.

The package body 31 is disposed on the bottom surface 301 of the substrate 30 and encapsulates the electronic components 34c, 34d, the coil 33 and a portion of the magnetically permeable element 32. In some embodiments, the package body 31 includes an epoxy resin including fillers dispersed therein.

The electrical connection 36 includes a first portion 36a and a second portion 36b. The first portion 36a of the electrical connection 36 penetrates the package body 31 and is electrically connected to a conductive pad 30p on the bottom surface 301 of the substrate 30. The second portion 36b of the electrical connection 36 is exposed from the package body 31 to be electrically connected to external devices.

The magnetically permeable element 32 includes five segments 32a, 32b, 32c, 32d and 32e. The segments 32a and 32d are disposed on the bottom surface 301 of the substrate 30 and encapsulated by the package body 31. The segment 32c is disposed on a surface 311 of the package body 31. The segment 32b penetrates the package body 31 and connects the segment 32a with the segment 32c. The segment 32e penetrates the package body 31 and connects the segment 32d with the segment 32c. In some embodiments, a thickness of the segments 32b, 32e is the same as or larger than those of the segments 32a, 32d. In some embodiments, the magnetically permeable element 32 may include a magnetic layer and a conductive layer which is electrically connected to a grounding pad on the bottom surface 301 of the substrate 30. The segments 32b, 32c and 32e cover the electronic components 34c, 34d to reduce the likelihood of (e.g., prevent) the electronic components 34c, 34d from being interfered with by undesired magnetic fields.

The magnetically permeable element 32 is, or includes, a material with a high permeability and low magnetic saturation. The magnetically permeable element 32 can be, or can include, for example, Ferrite (e.g., $Fe_2O_3$, $ZnFe_2O_4$, $Mn_aZn_{(1-a)}Fe_2O_4$ or $Ni_aZn_{(1-a)}Fe_2O_4$), Ferroalloy (e.g., FeSi, FeSiMg, FeP or FeNi), magnetic adhesive or other magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetically permeable element 32 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured at room temperature and at a particular field strength, such as about 0.5 Tesla or about 0.002 Tesla. In some embodiments, the permeability of the magnetically permeable element 32 is in a range from about 500 H/m to about 3000 H/m.

The coil 33 is disposed within the package body 31 and encapsulated by the package body 31. The coil 33 surrounds the segments 32b, 32e of the magnetically permeable element 32. In some embodiments, an inner diameter D4 of the coil 33 is greater than a width D5 of the segment 32c of the magnetically permeable element 32. For example, a projection of the segment 32c of the magnetically permeable element 32 on the bottom surface 301 of the substrate 30 (e.g., a vertical projection extending from the segment 32c to the bottom surface 301 of the substrate 30) and a projection of the coil 33 on the bottom surface 301 of the substrate 30 (e.g., a vertical projection extending from the coil 33 to the bottom surface 301 of the substrate 30) do not overlap. In addition, a projection of the segments 32a, 32d of the magnetically permeable element 32 on the bottom surface 301 of the substrate 30 (e.g., a vertical projection extending from the segments 32a, 32d to the bottom surface 301 of the substrate 30) overlaps a projection of the coil 33 on the bottom surface 301 of the substrate 30 (e.g., a vertical projection extending from the coil 33 to the bottom surface 301 of the substrate 30).

The coil 33 is, or includes, a conductive material such as a metal or metal alloy. Examples include Au, Ag, Al, Cu, or an alloy thereof. The coil 33 can be magnetically coupled to a magnetic field to induce a current within the coil 33. In some embodiments, the induced current is provided to the electronic components 34a, 34b, 34c, 34d through a conductive line 33c and the interconnection structure (e.g., the RDL) within the substrate 30, so as to power the electronic components 34a, 34b, 34c, 34d or other electronic components external to the semiconductor package device 3. Thus, the coil 33 performs as a wireless receiver (e.g., a charging coil).

In comparison with the semiconductor package device 1 in FIG. 1, the semiconductor package device 3 could accommodate more electronic components, which would reduce the total size of the semiconductor package device 3.

Figure 4:
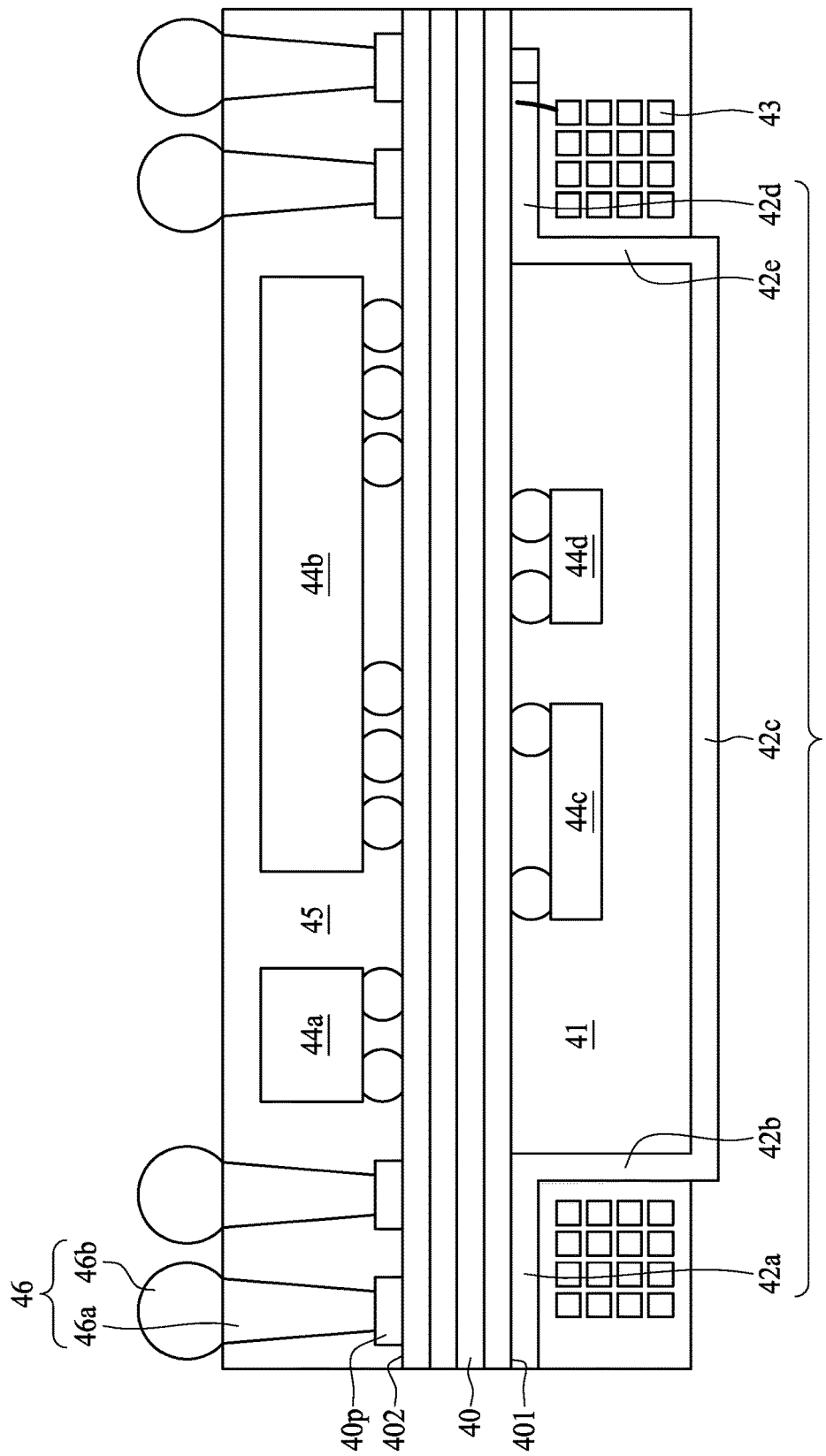
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 3 in FIG. 3, except that the semiconductor package device 4 further includes a second package body 45 disposed on a top surface 402 of a substrate 40. The semiconductor package device 4 includes the substrate 40 (e.g., similar to the substrate 30), a first package body 41 (e.g., similar to the package body 31), a magnetically permeable element 42 (e.g., similar to the magnetically permeable element 32), a coil 43 (e.g., similar to the coil 33), electronic components 44a, 44b, 44c, 44d (e.g., similar to electronic components 34a, 34b, 34c, 34d, respectively), and the second package body 45.

The second package body 45 is disposed on the top surface 402 of the substrate 40 to cover the electronic components 44a, 44b. In some embodiments, the second package body 45 includes an epoxy resin including fillers dispersed therein.

The electrical connection 46 includes a first portion 46a and a second portion 46b. The first portion 46a of the electrical connection 46 penetrates the second package body 45 and is electrically connected to a conductive pad 40p on the top surface 402 of the substrate 40. The second portion 46b of the electrical connection 46 is exposed from the second package body 45 to be electrically connected to external devices.

Figure 5:
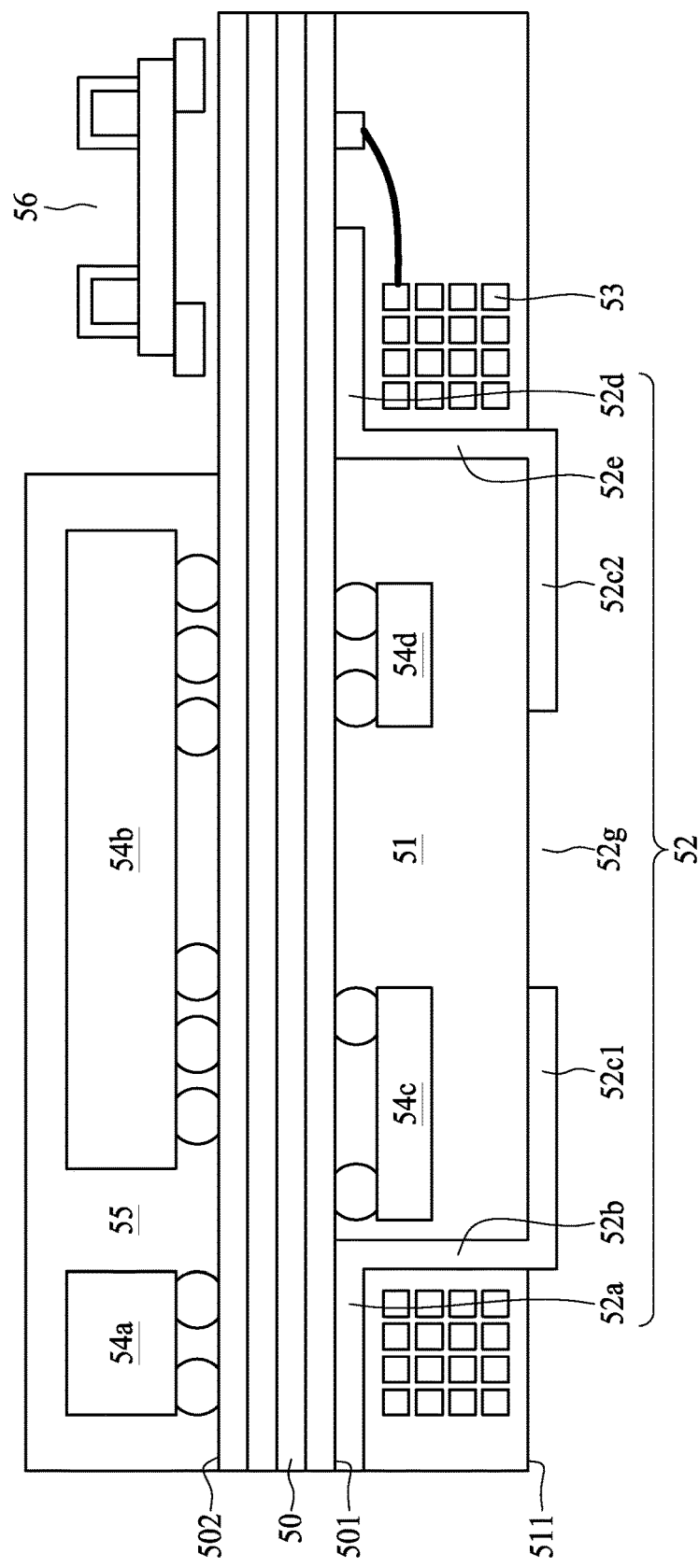
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 is similar to the semiconductor package device 3 in FIG. 3, except that the semiconductor package device 5 further includes a connector 56 and an opening 52g formed on a magnetically permeable element 52. The semiconductor package device 5 includes a substrate 50 (e.g., similar to the substrate 30), a first package body 51 (e.g., similar to the package body 31), a second package body 55 (e.g., similar to the second package body 45), the magnetically permeable element 52, a coil 53 (e.g., similar to the coil 33), and electronic components 54a, 54b, 54c, 54d (e.g., similar to electronic components 34a, 34b, 34c, 34d, respectively).

The connector 56 is disposed on the top surface 502 of the substrate 50 and is exposed from the second package body 55. The connector 56 may include a plurality of pins to provide electrical connections between the electronic components 54a, 54b, 54c, 54d and external circuits.

A segment 52c1 and a segment 52c2 of the magnetically permeable element 52 are disposed on a surface 511 of the first package body 51. The segment 52c1 is connected with a segment 52a of the magnetically permeable element 52 through a segment 52b of the magnetically permeable element 52. The segment 52c2 is connected with a segment 52d of the magnetically permeable element 52 through a segment 52e of the magnetically permeable element 52. The segment 52c1 and the segment 52c2 are physically separated from each other by the opening 52g. The opening 52g is used to facilitate the formation of the first package body 51 because the molding compound can be easily injected into the space defined by the segments 52b, 52c1, 52c2, 52e to encapsulate the electronic components 54c, 54d through the opening 52g.

FIGS. 6A, 6B, 6C, 6D and 6E illustrate a semiconductor manufacturing method in accordance with some embodiments of the present disclosure.

Figure 6A:
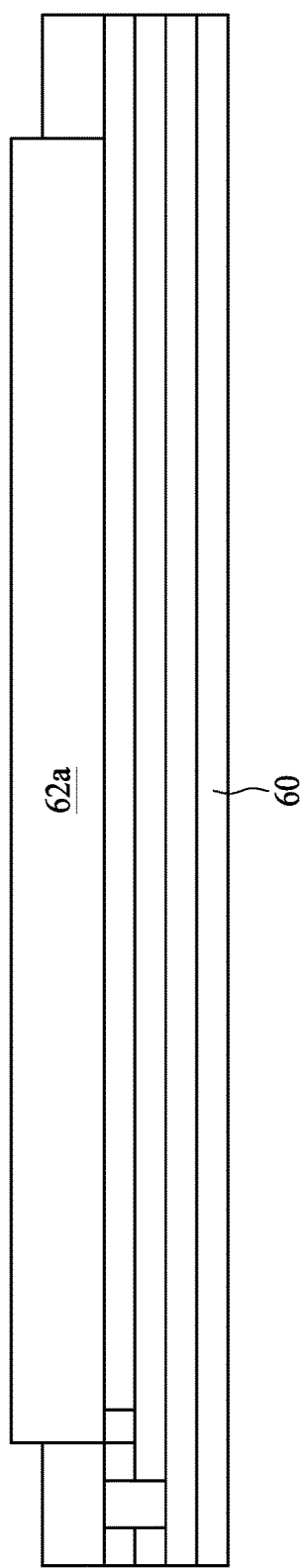
FIG. 6A, FIG. 6B, FIG. 6C, FIG. 6D and FIG. 6E illustrate a semiconductor manufacturing method in accordance with some embodiments of the present disclosure.

Referring to FIG. 6A, a substrate 60 is provided. The substrate 60 may include, for example, a printed circuit board, such as a paper-based copper foil laminate, a composite copper foil laminate, or a polymer-impregnated glass-fiber-based copper foil laminate. A magnetically permeable layer 62a is formed on the substrate 60. The magnetically permeable layer 62a may be formed by attaching a Ferrite sheet, sputtering or platting Ferroalloy, coating or filling magnetic adhesive or by other suitable processes. In some embodiments, an adhesive layer can be formed on the substrate 60 prior to the formation of the magnetically permeable layer 62a.

Figure 6B:
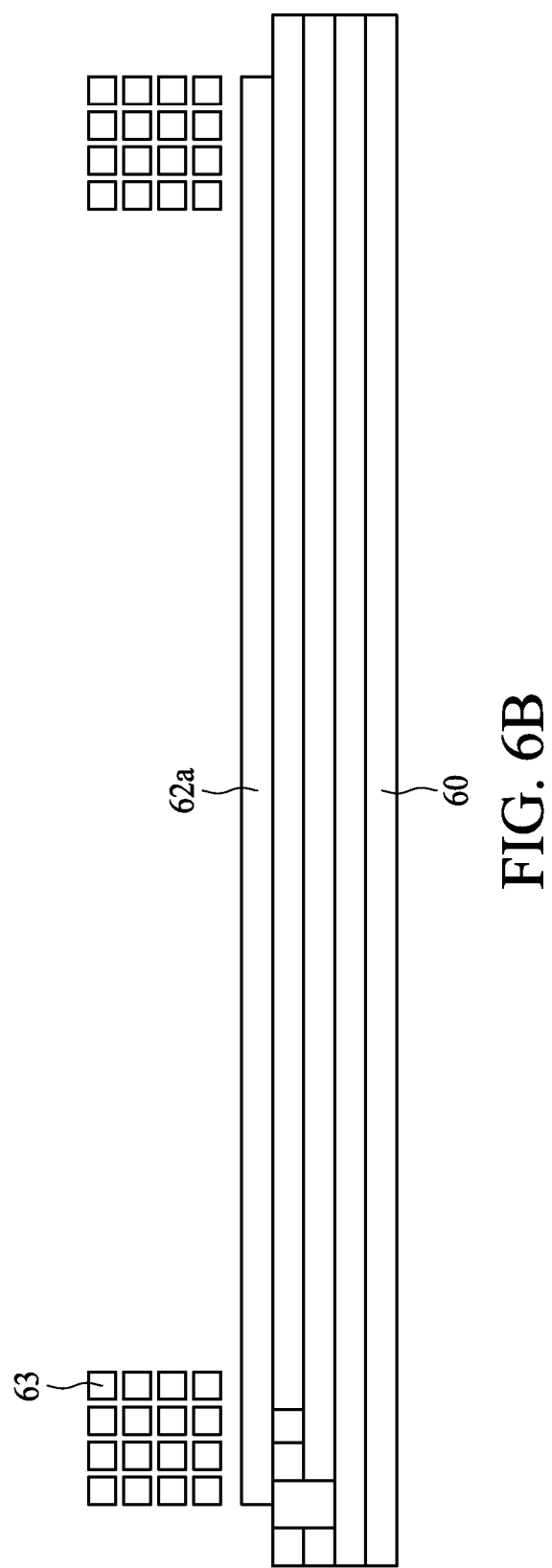

Referring to FIG. 6B, a coil 63 is formed on the magnetically permeable layer 62a. In other words, the coil 63 overlaps the magnetically permeable layer 62a.

Figure 6C:
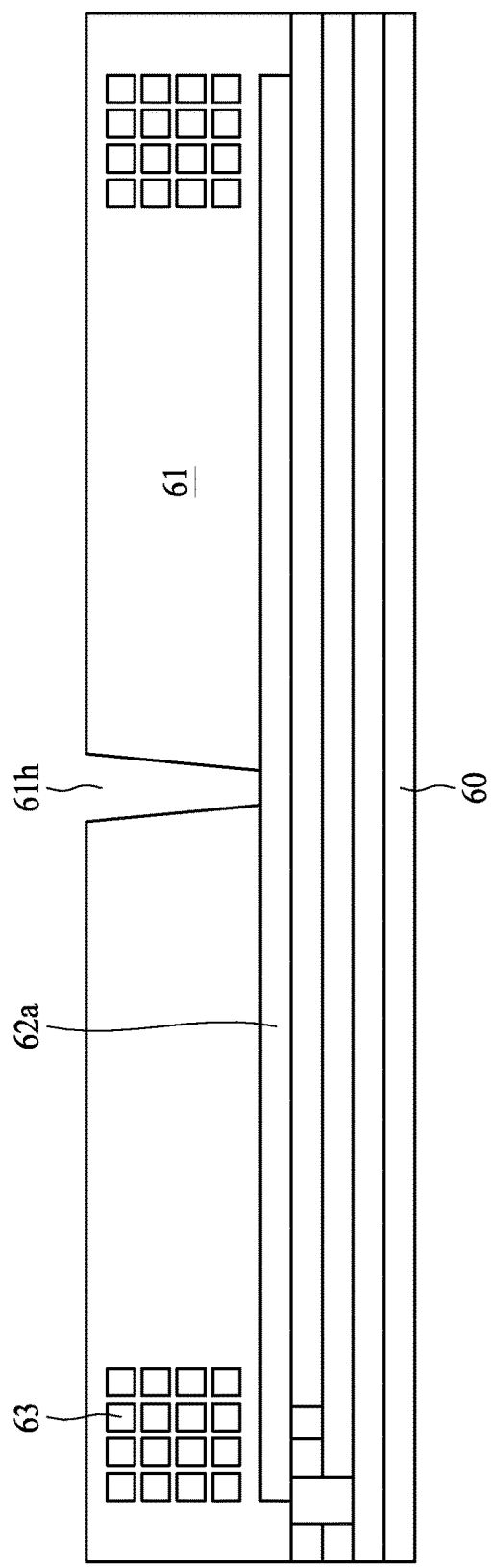

Referring to FIG. 6C, a package body 61 is formed on the substrate 60 to cover the coil 63 and the magnetically permeable layer 62a. In some embodiments, the package body 61 includes an epoxy resin including fillers dispersed therein. An opening 61h is then formed to penetrate the package body 61 to expose the magnetically permeable layer 62a. In some embodiments, the opening 61h can be formed by drilling, laser drilling or etching.

Figure 6D:
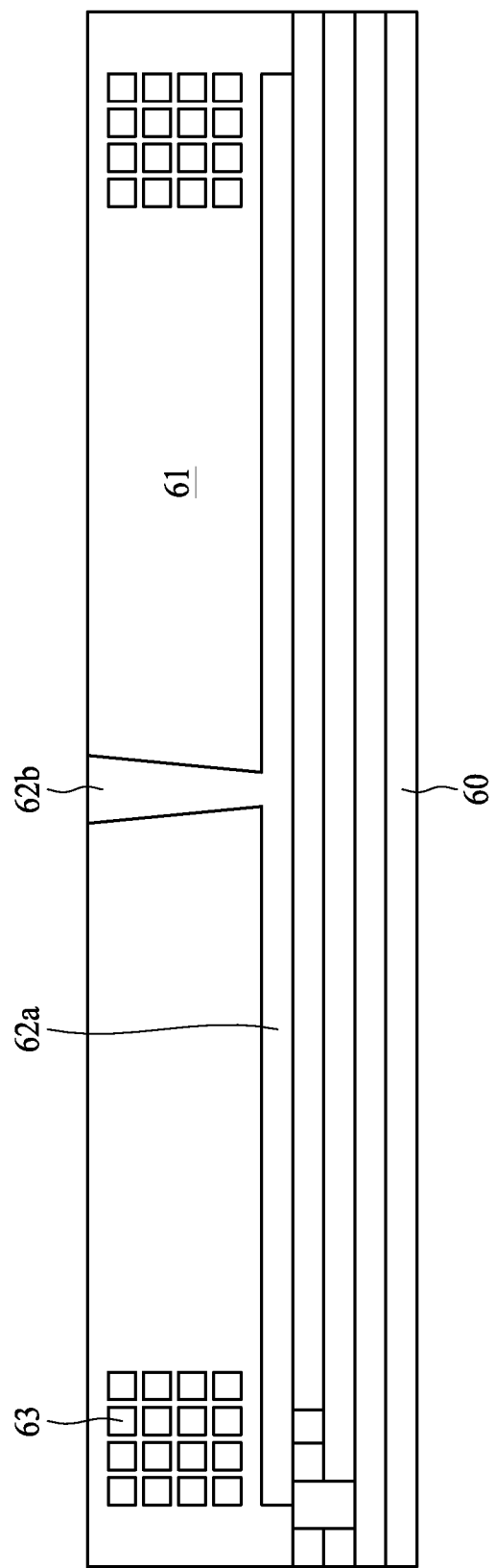

Referring to FIG. 6D, a magnetically permeable layer 62b is formed to fill the opening 61h. In some embodiments, the magnetically permeable layer 62b and the magnetically permeable layer 62a are formed of the same material. Alternatively, they can include different materials. In some embodiments, a thickness of the magnetically permeable layer 62b is the same as or larger than that of the magnetically permeable layer 62a.

Figure 6E:
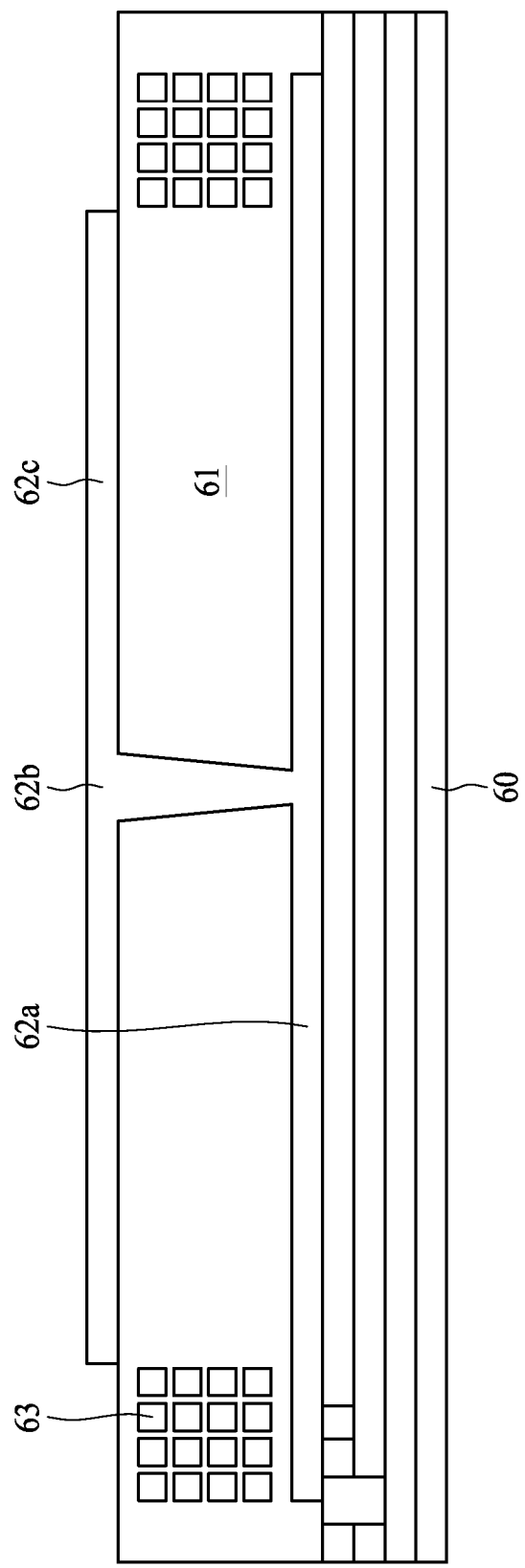

Referring to FIG. 6E, a magnetically permeable layer 62c is formed on the package body 61 to contact the magnetically permeable layer 62b. The magnetically permeable layer 62c and the coil 63 do not overlap. In some embodiments, the magnetically permeable layer 62c and the magnetically permeable layer 62b are formed of the same material. Alternatively, they can include different materials. After forming the magnetically permeable layer 62c, electronic components may be formed on an opposite surface of the substrate 60 to form the semiconductor package device 1 as shown in FIG. 1. In some embodiments, an adhesive layer can be formed on the package body 61 prior to the formation of the magnetically permeable layer 62c.

In some embodiments, forming the magnetically permeable layer 62c may further include the following operations: (i) forming a protective layer (e.g., a mask or stencil) on the package body 61 and above the coil 63; (ii) forming the magnetically permeable layer 62c on a portion of the package body 61 that is not covered by the protective layer; and (iii) removing the protective layer. In some embodiments, the operation of forming the magnetically permeable layer 62c is the same as that of forming the magnetically permeable layer 62a. Alternatively, they can be formed by different operations.

FIGS. 7A, 7B, 7C and 7D illustrate a semiconductor manufacturing method in accordance with some embodiments of the present disclosure.

Referring to FIG. 7A, a substrate 70 is provided. The substrate 70 may include, for example, a printed circuit board, such as a paper-based copper foil laminate, a composite copper foil laminate, or a polymer-impregnated glass-fiber-based copper foil laminate. A magnetically permeable layer 72a is formed on the substrate 70. The magnetically permeable layer 72a may be formed by attaching a Ferrite sheet, sputtering or platting Ferroalloy, coating or filling magnetic adhesive or by other suitable processes.

Figure 7B:
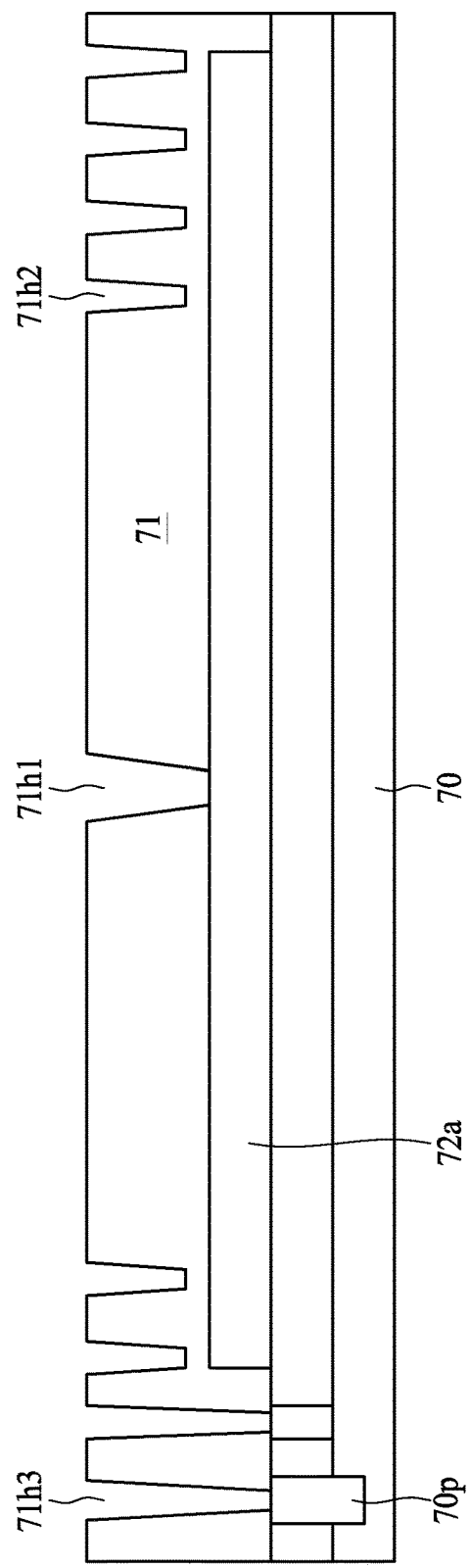

Referring to FIG. 7B, a package body 71 is formed on the substrate 70 to cover the magnetically permeable layer 72a. An opening 71h1 is formed to penetrate the package body 71 to expose the magnetically permeable layer 72a. A plurality of openings 71h2 are formed to penetrate the package body 71 without exposing the magnetically permeable layer 72a. At least one opening 71h3 is formed to penetrate the package body 71 to expose a conductive pad 70p on the substrate 70. In some embodiments, the openings 71h1, 71h2 and 71h3 can be formed by drilling, laser drilling or etching.

Figure 7C:
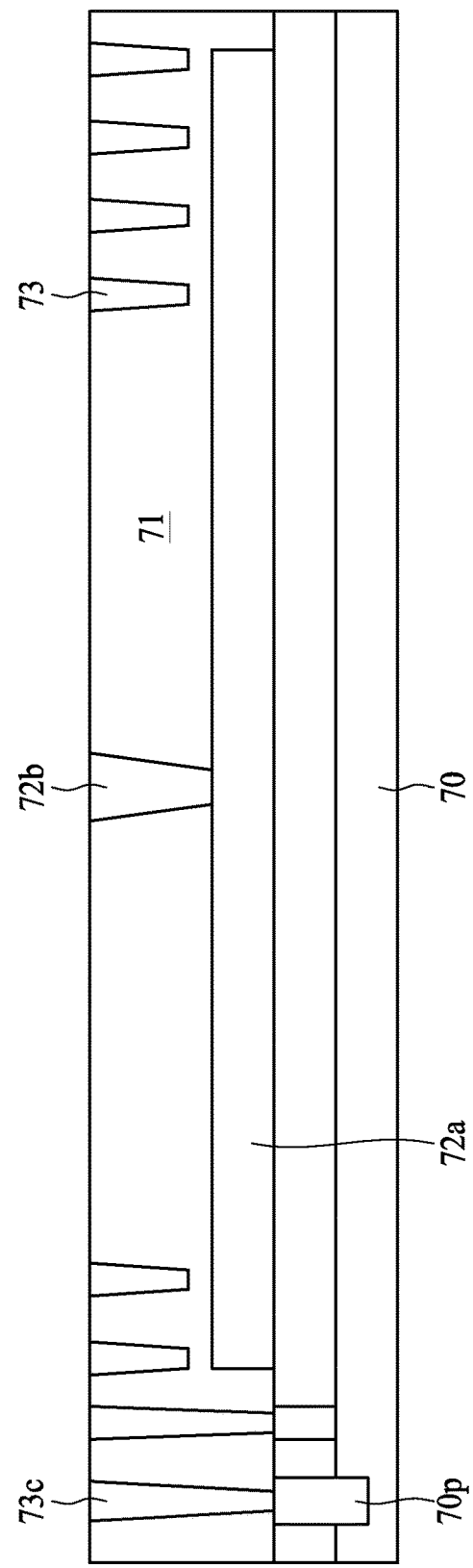

Referring to FIG. 7C, a magnetically permeable layer 72b is formed to fill the opening 71h1. In some embodiments, the magnetically permeable layer 72b and the magnetically permeable layer 72a are formed of the same material. Alternatively, they can include different materials. In some embodiments, a thickness of the magnetically permeable layer 72b is the same as or larger than that of the magnetically permeable layer 72a.

A conductive material is formed within the openings 71h2 and 71h3 to form a coil 73 and the conductive line 73c connecting the coil 73 with the conductive pad 70p of the substrate 70. The coil 73 overlaps the magnetically permeable layer 72a.

Figure 7D:
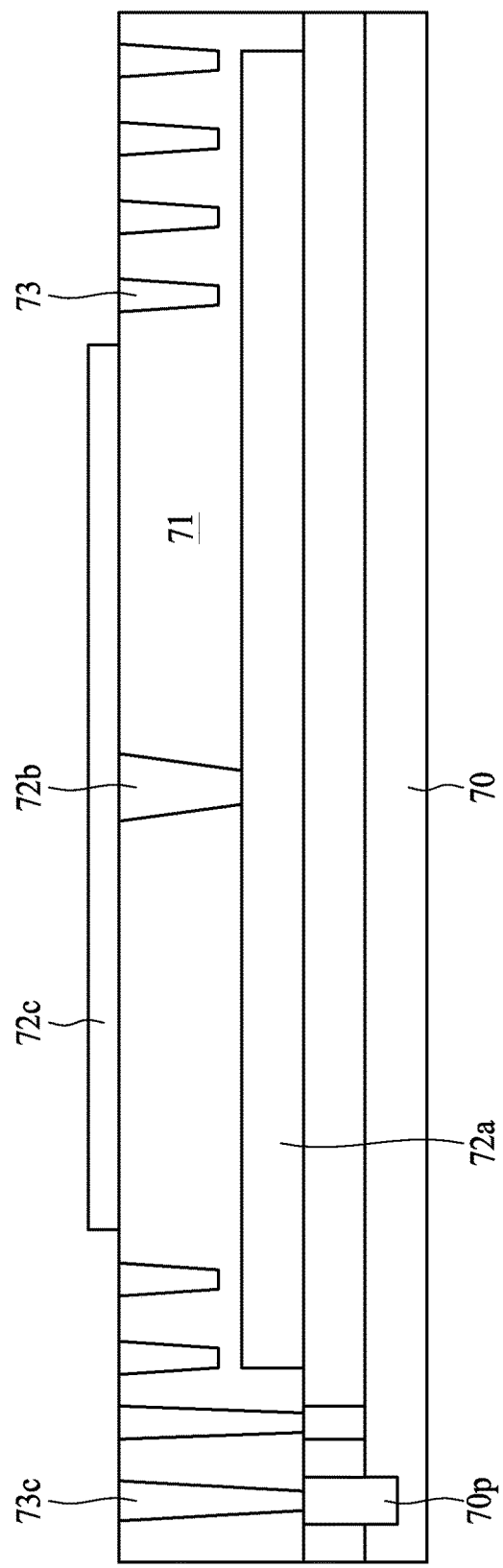

Referring to FIG. 7D, a magnetically permeable layer 72c is formed on the package body 71 to contact the magnetically permeable layer 72b. The magnetically permeable layer 72c and the coil 73 do not overlap. In some embodiments, the magnetically permeable layer 72c and the magnetically permeable layer 72b are formed of the same material. Alternatively, they can include different materials. After forming the magnetically permeable layer 72c, electronic components may be formed on an opposite surface of the substrate 70 to form the semiconductor package device 1 as shown in FIG. 1. In some embodiments, forming the magnetically permeable layer 72c may further include the following operations: (i) forming a protective layer (e.g., a mask or stencil) on the package body 71 to cover the coil 73; (ii) forming the magnetically permeable layer 72c on a portion of the package body 71 that is not covered by the protective layer; and (iii) removing the protective layer. In some embodiments, the operation of forming the magnetically permeable layer 72c is the same as that of forming the magnetically permeable layer 72a. Alternatively, they can be formed by different operations. After forming the magnetically permeable layer 72c, electronic components may be formed on an opposite surface of the substrate 70 to form the semiconductor package device 1 as shown in FIG. 1.

FIGS. 8A, 8B, 8C and 8D illustrate a semiconductor manufacturing method in accordance with some embodiments of the present disclosure.

Figure 8A:
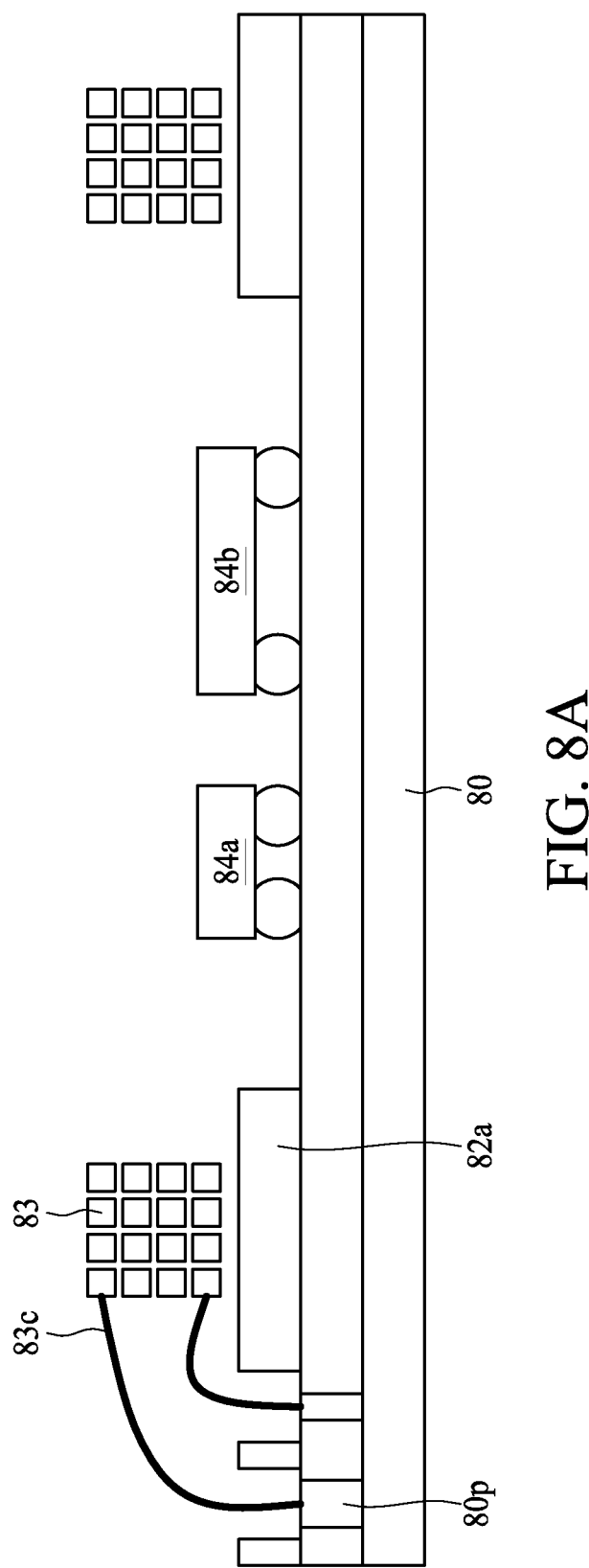
FIG. 8A, FIG. 8B, FIG. 8C and FIG. 8D illustrate a semiconductor manufacturing method in accordance with some embodiments of the present disclosure.

Referring to FIG. 8A, a substrate 80 is provided. The substrate 80 may include, for example, a printed circuit board, such as a paper-based copper foil laminate, a composite copper foil laminate, or a polymer-impregnated glass-fiber-based copper foil laminate. A magnetically permeable layer 82a is formed on a portion of the substrate 80. The magnetically permeable layer 82a may be formed by attaching a Ferrite sheet, sputtering or platting Ferroalloy, coating or filling magnetic adhesive or by other suitable processes.

A coil 83 is formed on the magnetically permeable layer 82a. The coil 83 is electrically connected with a conductive pad 80p on the substrate 80 through a conductive line 83c.

Electronic components 84a, 84b are formed on a surface of the substrate 80 that is not covered by the magnetically permeable layer 82a. The electronic component 84a may include a passive electronic component, such as a capacitor, a resistor or an inductor. The electronic component 84b may include an active electronic component, such as an IC chip or a die. The electronic components 84a, 84b may be connected to the substrate 80 by flip-chip or wire-bond techniques.

Figure 8B:
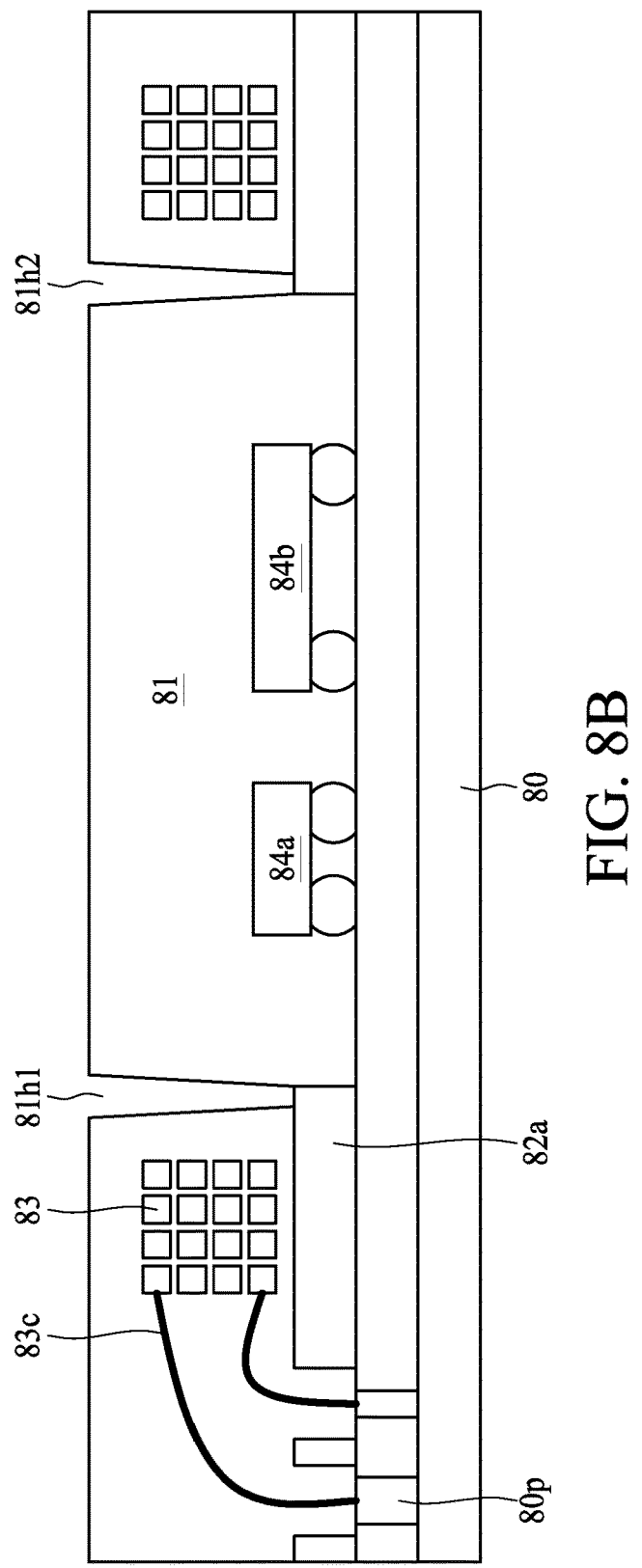

Referring to FIG. 8B, a package body 81 is formed on the substrate 80 to cover the magnetically permeable layer 82a. Openings 81h1 and 81h2 are formed to penetrate the package body 81 to expose the magnetically permeable layer 82a. In some embodiments, the openings 81h1 and 81h2 can be formed by drilling, laser drilling or etching.

Figure 8C:
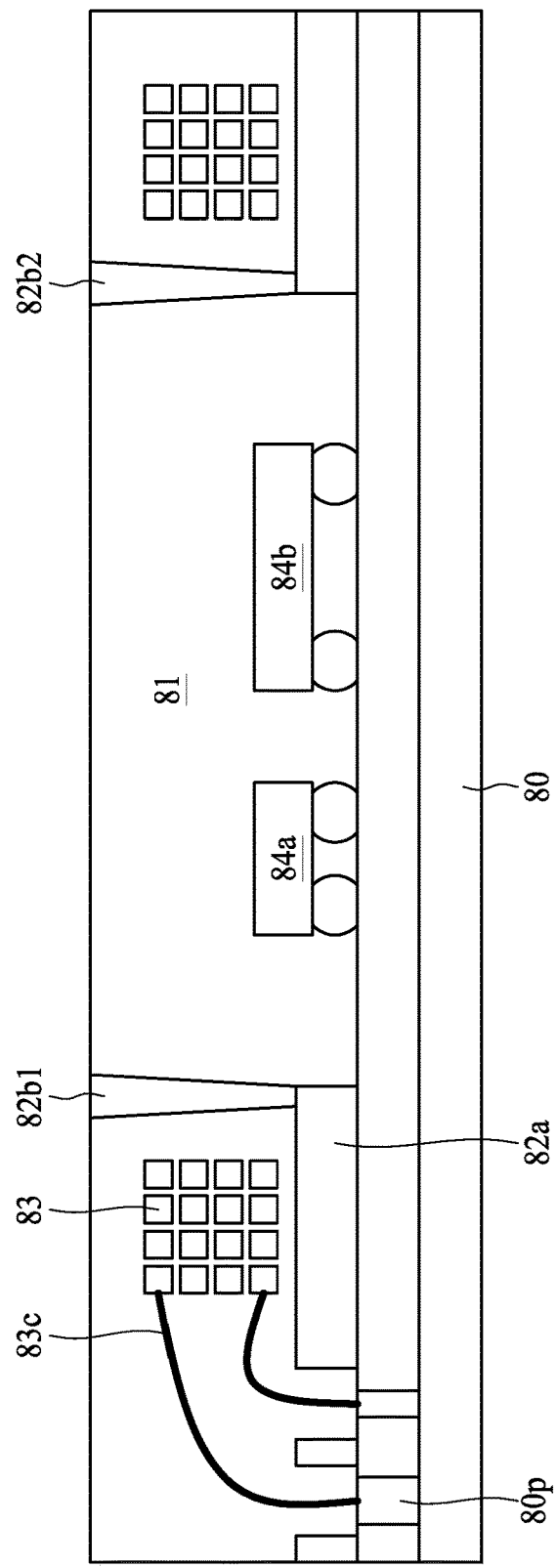

Referring to FIG. 8C, a magnetically permeable layer 82b1 is formed to fill the opening 81h1 and a magnetically permeable layer 82b2 is formed to fill the opening 81h2. In some embodiments, the magnetically permeable layers 82b1, 82b2 and the magnetically permeable layer 82a are formed of the same material. Alternatively, they can include different materials. In some embodiments, a thickness of the magnetically permeable layers 82b1, 82b2 is the same as or larger than that of the magnetically permeable layer 82a.

Figure 8D:
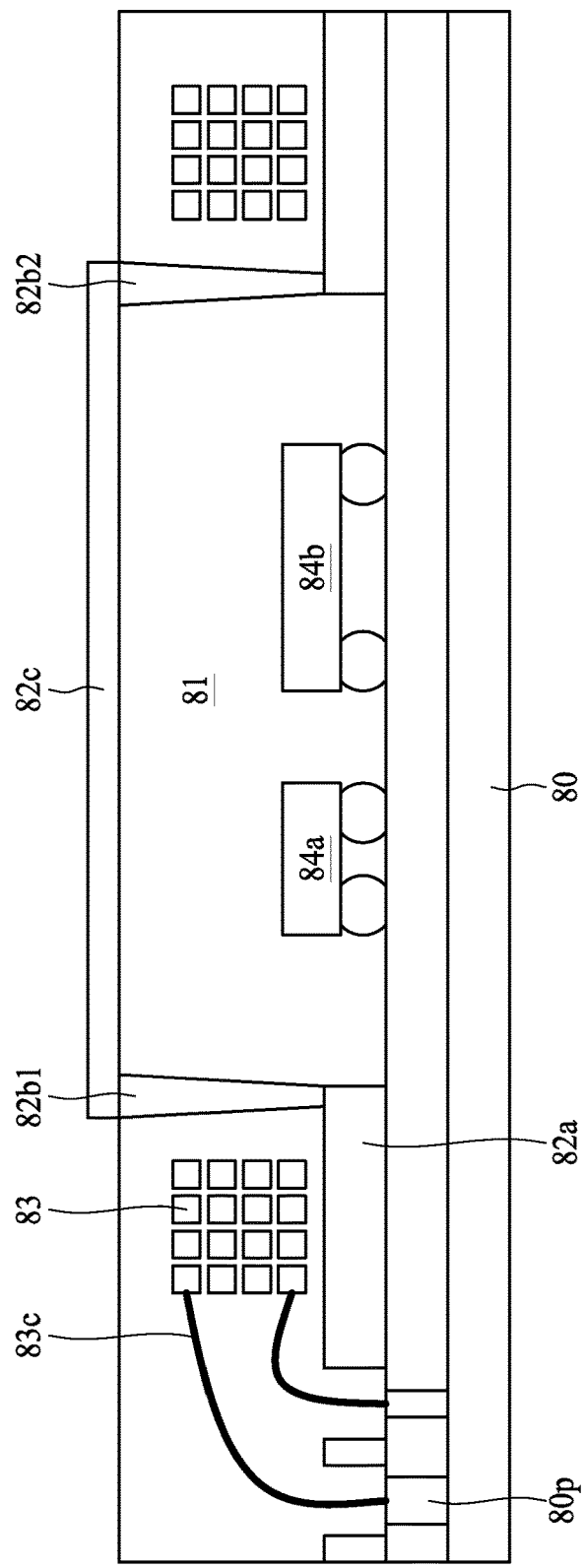

Referring to FIG. 8D, a magnetically permeable layer 82c is formed on the package body 81 to contact the magnetically permeable layers 82b1 and 82b2. The magnetically permeable layer 82c and the coil 83 do not overlap. In some embodiments, the magnetically permeable layer 82c and the magnetically permeable layers 82b1, 82b2 are formed of the same material. Alternatively, they can include different materials. After forming the magnetically permeable layer 82c, electronic components may be formed on an opposite surface of the substrate 80 to form the semiconductor package device 3 as shown in FIG. 3. In some embodiments, forming the magnetically permeable layer 82c may further include the following operations: (i) forming a protective layer (e.g., a mask or stencil) on the package body 81 and above the coil 83; (ii) forming the magnetically permeable layer 82c on a portion of the package body 81 that is not covered by the protective layer; and (iii) removing the protective layer. In some embodiments, the operation of forming the magnetically permeable layer 82c is the same as that of forming the magnetically permeable layer 82a. Alternatively, they can be formed by different operations.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a substrate including a first surface;
    a first package body encapsulating the first surface of the substrate;
    a permeable element including a first portion disposed on the first surface of the substrate and a second portion disposed on the first package body; and
    a coil within the first package body,
    wherein the first portion of the permeable element and the second portion of the permeable element are separated by the first package body.

2. The semiconductor device package of claim 1, wherein the permeable element further comprises a third portion within the first package body and connecting the first portion of the permeable element with the second portion of the permeable element.

3. The semiconductor device package of claim 2, wherein the coil surrounds the third portion of the permeable element.

4. The semiconductor device package of claim 2, wherein a thickness of the third portion of the permeable element is the same as or larger than a thickness of the first portion of the permeable element.

5. The semiconductor device package of claim 2, wherein the permeable element further comprises:
    a fourth portion disposed on the first surface of the substrate and physically separated from the first portion of the permeable element; and
    a fifth portion within the first package body and connecting the fourth portion of the permeable element with the second portion of the permeable element.

6. The semiconductor device package of claim 5, further comprising an electronic component disposed on the first surface of the substrate and encapsulated by the first package body, wherein the electronic component is disposed between the third portion of the permeable element and the fifth portion of the permeable element.

7. The semiconductor device package of claim 5, wherein a thickness of the fifth portion of the permeable element is the same as or larger than a thickness of the fourth portion of the permeable element.

8. The semiconductor device package of claim 1, wherein the permeable element includes a magnetic layer and a conductive layer, the conductive layer electrically connected to a grounding pad on the first surface of the substrate.

9. The semiconductor device package of claim 1, further comprising:
    an electronic component disposed on a second surface of the substrate opposite to the first surface; and
    an electrical connection disposed on the first surface of the substrate, the electrical connection including a first portion encapsulated by the first package body and a second portion exposed from the first package body.

10. The semiconductor device package of claim 1, further comprising:
    an electronic component disposed on a second surface opposite to the first surface of the substrate;
    an electrical connection disposed on the second surface of the substrate; and
    a second package body encapsulating the electronic component and a first portion of the electrical connection and exposing a second portion of the electrical connection.

11. A semiconductor device package, comprising:
    a substrate including a first surface;
    a first package body encapsulating the first surface of the substrate;
    a permeable element including a first portion disposed on the first surface of the substrate and a second portion disposed on the first package body; and
    a coil within the first package body, wherein a width of the second portion of the permeable element is less than an inner width of the coil,
    wherein the first portion of the permeable element and the second portion of the permeable element are separated by the first package body.

12. The semiconductor device package of claim 11, wherein a length of the first portion of the permeable element is greater than the inner width of the coil.

13. The semiconductor device package of claim 11, wherein the permeable element further comprises a third portion within the first package body and connecting the first portion of the permeable element with the second portion of the permeable element.

14. The semiconductor device package of claim 11, further comprising:
an electronic component disposed on a second surface of the substrate opposite to the first surface; and
an electrical connection disposed on the first surface of the substrate, the electrical connection including a first portion encapsulated by the first package body and a second portion exposed from the first package body.

15. The semiconductor device package of claim 11, further comprising:
an electronic component disposed on a second surface opposite to the first surface of the substrate;
an electrical connection disposed on the second surface of the substrate; and
a second package body encapsulating the electronic component and a first portion of the electrical connection and exposing a second portion of the electrical connection.

16. A semiconductor device package, comprising:
a substrate including a first surface;
a first package body encapsulating the first surface of the substrate;
a permeable element including a first portion disposed on the first surface of the substrate and a second portion disposed on the first package body; and
a coil within the first package body,
wherein a projection of the second portion of the permeable element onto the first surface of the substrate and a projection of the coil onto the first surface of the substrate do not overlap.

17. The semiconductor device package of claim 16, wherein a projection of the first portion of the permeable element onto the first surface of the substrate overlaps the projection of the coil onto the first surface of the substrate.

18. The semiconductor device package of claim 16, wherein the permeable element further comprises a third portion within the first package body and connecting the first portion of the permeable element with the second portion of the permeable element.

19. The semiconductor device package of claim 18, wherein the permeable element further comprises:
a fourth portion disposed on the first surface of the substrate and physically separated from the first portion of the permeable element; and
a fifth portion within the first package body and connecting the fourth portion of the permeable element with the second portion of the permeable element.

20. The semiconductor device package of claim 19, further comprising an electronic component disposed on the first surface of the substrate and encapsulated by the first package body, wherein the electronic component is disposed between the third portion of the permeable element and the fifth portion of the permeable element.

* * * * *